United States Patent
Le Cras et al.

(10) Patent No.: US 10,199,634 B2
(45) Date of Patent: Feb. 5, 2019

(54) METHOD FOR PREPARING AN AMORPHOUS FILM MADE FROM LITHIATED METAL SULFIDE OR OXYSULFIDE

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); INSTITUT POLYTECHNIQUE DE BORDEAUX, Talence (FR)

(72) Inventors: Frederic Le Cras, Villenave D'Ornon (FR); Vincent Dubois, Bordeaux (FR); Delphine Guy-Bouyssou, Luynes (FR); Brigitte Pecquenard, Villenave D'Ornon (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); INSTITUT POLYTECHNIQUE DE BORDEAUX, Talence (FR)

(*) Notice: Subject to any disclaimer, the term of this patent is extended or adjusted under 35 U.S.C. 154(b) by 26 days.

(21) Appl. No.: 14/893,831

(22) PCT Filed: Jun. 12, 2014

(86) PCT No.: PCT/FR2014/051448
§ 371 (c)(1),
(2) Date: Nov. 24, 2015

(87) PCT Pub. No.: WO2014/202875
PCT Pub. Date: Dec. 24, 2014

(65) Prior Publication Data
US 2016/0111709 A1    Apr. 21, 2016

(30) Foreign Application Priority Data
Jun. 20, 2013  (FR) .................................. 13 55882

(51) Int. Cl.
H01M 4/04       (2006.01)
C23C 14/06      (2006.01)
(Continued)

(52) U.S. Cl.
CPC ........... H01M 4/0426 (2013.01); C23C 14/06 (2013.01); C23C 14/0623 (2013.01);
(Continued)

(58) Field of Classification Search
None
See application file for complete search history.

(56) References Cited

U.S. PATENT DOCUMENTS

| | | | | |
|---|---|---|---|---|
| 5,696,224 A | * | 12/1997 | Benrabah | H01M 4/621 528/491 |
| 2007/0172738 A1 | | 7/2007 | Vinatier et al. | |
| 2011/0076567 A1 | | 3/2011 | Bouillon | |

FOREIGN PATENT DOCUMENTS

| | | | | |
|---|---|---|---|---|
| CN | 103147043 | * | 6/2013 | ............. C23C 14/08 |
| KR | 10-2013-0077805 | * | 7/2013 | ............. H01M 4/04 |

OTHER PUBLICATIONS

Martinez et al. Influence of the cation nature of high sulfur content oxysulfide thin films MOySz (M=W,Ti) studied by XPS. Applied surface science 236 2004, 377-386.*

(Continued)

*Primary Examiner* — Mandy C Louie
(74) *Attorney, Agent, or Firm* — Heslin Rothenberg Farley & Mesiti P.C.

(57) ABSTRACT

A method of preparing an amorphous film of lithiated metal sulfide or oxysulfide of formula $Li_\alpha M(O_{1-\beta}S_\beta)_\gamma$ using a lithiated target material:

(Continued)

M being advantageously selected from the group comprising Al, Ti, V, Cr, Mn, Fe, Co, Ni, Cu, Zn, Ge, Zr, Nb, Mo, Ag, Cd, In, Sn, Sb, Ta, W, Pb, Bi, and mixtures thereof; and $\alpha \geq 0.5$;

$1 \geq \beta \geq 2/3$;

$2 \geq \alpha/\gamma \geq 1/3$.

16 Claims, 7 Drawing Sheets

(51) Int. Cl.
| | |
|---|---|
| *C23C 14/34* | (2006.01) |
| *H01M 4/1397* | (2010.01) |
| *H01M 4/485* | (2010.01) |
| *H01M 4/58* | (2010.01) |
| *H01M 10/04* | (2006.01) |
| *H01M 10/0525* | (2010.01) |
| *H01M 4/136* | (2010.01) |
| *H01M 6/40* | (2006.01) |
| *H01M 4/02* | (2006.01) |

(52) U.S. Cl.
CPC ....... *C23C 14/3414* (2013.01); *H01M 4/0423* (2013.01); *H01M 4/1397* (2013.01); *H01M 4/485* (2013.01); *H01M 4/5815* (2013.01); *H01M 10/0436* (2013.01); *H01M 10/0525* (2013.01); *H01M 4/136* (2013.01); *H01M 6/40* (2013.01); *H01M 2004/028* (2013.01); *H01M 2220/30* (2013.01)

(56) References Cited

OTHER PUBLICATIONS

Park et al., "Synthesis and electrochemical properties of lithium nickel oxysulfide (LiNiSy02-y) material for lithium secondary batteries", Electrochimica Acta, Mar. 20, 2002, pp. 1721-1726, vol. 47, No. 11, XP004343888, ISSN: 0013-4686, Elsevier Science Publishers, Barking, GB.

Joo et al., "Lithium ion conducting lithium sulfur oxynitride this film", Electrochemcial and Solid-state Letters, Jul. 12, 2004, pp. A256-A258, vol. 7, No. 8, XP002721034, ISSN: 1099-0062, The Electrochem. Society, USA.

International Search Report for International Application No. PCT/FR2014/051448, dated Aug. 27, 2014.

* cited by examiner

METHOD FOR PREPARING AN AMORPHOUS FILM MADE FROM LITHIATED METAL SULFIDE OR OXYSULFIDE

CROSS REFERENCE TO RELATED APPLICATIONS

This application is a national stage filing under section 371 of International Application No. PCT/FR2014/051448, filed on Jun. 12, 2014, and published in French on Dec. 24, 2014 as WO 2014/202875, and claims priority to French Application No. 1355882, filed on Jun. 20, 2013. The entire disclosures of each of the prior applications are hereby incorporated herein by reference.

FIELD OF THE INVENTION

The invention relates to a method of preparing an amorphous film based on lithiated metal sulfide or oxysulfide, from a lithiated target material.

The field of use of the present invention particularly comprises the preparation of electrodes for lithium microbatteries.

PRIOR STATE OF THE ART

Generally, a battery comprises a stack of the following elements:
- a first current collector;
- a positive electrode;
- an electrolyte;
- a negative electrode;
- a second current collector.

Microbatteries are formed of thin films and have a micrometric thickness, and the total thickness of these elements generally does not exceed 15 micrometers.

Lithium micro-batteries comprise, in particular, "all solid state" microbatteries having an electrolyte in solid form.

For the preparation of the components of a battery (electrodes, solid electrolyte), vacuum deposition techniques are particularly adapted, and particularly the cathode sputtering of a specific target material.

Electrode materials capable of being used in such batteries includes $TiO_yS_x$-type components, given their lithium insertion/deinsertion potential (1-2.5 V/Li$^+$/Li) and their ability to reversibly insert lithium.

They may particular enable to form a battery of metal lithium/solid electrolyte/TiOS type.

However, the lithium melting temperature (180° C.) limits the use of this type of microbatteries, due to the temperatures reached in solder/sealing operations (in the order of 260° C.).

Accordingly, new battery configurations have been developed, and particularly:
- lithium-ion, $Li_xTiO_yS_z$/solid electrolyte/negative electrode active material batteries, where the negative electrode material enables to electrochemically insert lithium, and this, reversibly, at a low potential. This material, temperature-stable up to at least 300° C., may be a compound such as, for example, Si, Ge, Al, or Ag;
- so-called "lithium free", $LiCoO_2$/solid electrolyte/current collector batteries, where the negative lithium electrode is generated in situ on the current collector during the first charge of the battery, this lithium being initially present in the positive electrode. The current collector may be selected from among metals forming no alloy with lithium, such as, for example, titanium, copper, or tungsten.

In these two configurations, lithium is incorporated into the positive electrode on manufacturing of the microbattery. For example, the preparing of a lithiated electrode material such as $Li_xTiO_yS_z$ comprises the steps of:
- depositing a film of titanium oxysulfide $TiO_yS_z$ on a substrate, particularly by cathode sputtering. Such a deposition is performed from a titanium target, and under a partial $H_2S$ pressure, or from a titanium sulfide target under a pure argon atmosphere;
- depositing lithium on the film thus obtained, particularly by thermal evaporation of metal lithium under partial vacuum.

The completion and the homogenizing of the $TiO_yS_z$ film by lithium diffusion require a few hours, before any subsequent deposition of an additional layer or, possibly, of an electrolyte.

This method thus implies two different depositions (titanium-based layer, followed by a lithiated layer), as well as a step of homogenizing the layer formed by lithium diffusion.

Accordingly, the composition and the homogeneity of the successive layers may vary from one sample to the other. On the other hand, there may be an issue regarding the regularity of the film properties.

Further, since the steps of preparing the $TiO_yS_z$ film and of lithium evaporation are not carried out in a same enclosure, this method requires a transfer of the $TiO_yS_z$ material, which is hygroscopic, thus increasing risks of damage.

The Applicant has developed a method enabling to overcome these shortcomings. By implementing a single step, this method requires no transfer of material.

On the other hand, the method forming the object of the invention comprises no lithium diffusion step. It uses no hydrogen sulfide and metal lithium, which compounds have respective reactivities making their handling quite touchy.

The method forming the object of the invention optimizes the preparation of homogeneous amorphous films of $LiMO_yS_z$ type from a target material.

DISCUSSION OF THE INVENTION

The invention aims at a method of preparing amorphous films of lithiated metal sulfides or oxysulfides, from a lithiated target material.

Unlike prior art methods implying multiple steps of deposition, evaporation, and diffusion for several hours, the method forming the object of the invention requires a single step of depositing a film of homogeneous composition.

Film or thin film means a deposition of at least one layer of a material. The total thickness of the film is generally smaller than 10 micrometers.

Further, amorphous lithiated metal sulfide also means a film comprising oxysulfides.

More specifically, the object of the invention relates to a method of preparing an amorphous film of lithiated metal sulfide or oxysulfide of formula $Li_\alpha M(O_{1-\beta}S_\beta)_\gamma$ by using a lithiated target material.

In formula $Li_\alpha M(O_{1-\beta}S_\beta)_\gamma$, M is a metal advantageously selected from the group comprising Al, Ti, V, Cr, Mn, Fe, Co, Ni, Cu, Zn, Ge, Zr, Nb, Mo, Ag, Cd, In, Sn, Sb, Ta, W, Pb, Bi, and mixtures thereof; and $\alpha \geq 0.5$;
$1 \geq \beta \geq 2/3$;
$2 \geq \alpha/\gamma \geq 1/3$.

Metal M advantageously is titanium.

The simultaneous presence in the material of lithium and sulfur (particularly in the form of sulfide ions $S^{2-}$) enables to jointly perform the deinsertion of lithium ions and the oxidation of sulfur-based ions, particularly in the context of a use of the film as a positive electrode material in a lithium battery or microbattery, preferably a Li-ion microbattery. Thus, when ratio S/O is at least greater than 2 and ratio Li/(S+O) is greater than 1/3, the electrode capacity is improved.

Unlike target materials used in prior art methods, the target material is a lithiated material. Generally, the target material comprises at least one metal M, sulfur, and lithium. It advantageously has formula $Li_\lambda M(O_{1-\delta}S_\delta)_\nu$, where:

$\lambda \geq 0.5$;
$1 \geq \delta \geq 2/3$;
$2 \geq \lambda/\nu \geq 1/3$.

Target material means a target composition corresponding to an average general composition. Indeed, the target material may be made of one or a plurality of materials (polyphase).

Metal M of the lithiated material is of course the same as that of the amorphous film.

The target material may particularly have formula $LiTiS_2$ when M=Ti, $\lambda=1$, $\delta=1$, $\nu=2$.

The coefficients of the general formulas of the film and of the target lithiated material are generally different. Indeed, due to the experimental conditions and to the possible presence of oxygen, the chemical composition of the obtained film may vary with respect to that of the target material. However, and according to a specific embodiment, the respective formulas of the lithiated target material and of the amorphous film may be identical.

The preparation of this amorphous film is advantageously performed by deposition of the lithiated target material on a substrate. This deposition may particularly be performed by:

cathode sputtering of the lithiated target material and associated techniques, for example, by IBAD ("Ion-Beam Assisted Deposition"), or by "ion plating";

evaporation of the lithiated target material, for example, by RPAE or "Reactive Plasma Assisted Evaporation", or by electron beam evaporation; or laser ablation of the lithiated target material, for example by PLD or "Pulsed Laser Deposition".

The cathode sputtering technique is generally carried out in a reactor or an enclosure. A target material is attached to a metal support used as a cathode. The cathode is then negatively biased by means of an electric generator. Under the effect of the electric field, the discharge gas contained in the enclosure (helium, neon, argon, or krypton, for example) is ionized. The positive ions of the ionized gas then bombard the target and expel atoms from the target.

These atoms then deposit back on the opposite surface where a substrate to be covered is placed, generally at a distance in the range from 5 to 12 cm. Thus, this technique enables to deposit a thin layer/film of material on a substrate.

Ablation is a deposition technique mainly comprising the sending of laser pulses on a target material. Such laser pulses (pulsed UV laser) enable to tear off atoms from the target material. The atoms then deposit on the surface of a substrate, to thus form a thin layer/film of material.

In the context of the invention, the substrate is advantageously electronically conductive It preferably is a current collector when the deposited film is intended to be used as an electrode material. Such a current collector is advantageously metallic.

As already indicated, the deposition by cathode sputtering is advantageously performed under an inert atmosphere, preferably under argon. However, according to a specific embodiment, it may be performed in a deposition enclosure in the presence of oxygen. The introduced oxygen may in particular appear in the form of molecular or atomic oxygen, metal oxide, or metal oxysulfide present in the target material. It may also result from the presence of moisture.

The composition of the amorphous film of formula $Li_\alpha M(O_{1-\beta}S_\beta)_\gamma$ thus depends on the oxygen concentration in the deposition enclosure where the method according to the invention is implemented, whether oxygen is deliberately introduced or not.

This concentration may be expressed in partial oxygen pressure (typically smaller than 10%) in the deposition enclosure, itself at a given total pressure (typically in the range from 0.2 to 2.5 Pa for the cathode sputtering). It will be within the abilities of those skilled in the art to adapt the quantity of oxygen and the pressure according to the target material used and to the desired amorphous film. Indeed, the pressure within the deposition enclosure may vary according to the implemented technique. It typically is in the range from $10^{-5}$ to 50 Pa for laser ablation.

Oxygen thus enables to form oxysulfides having their presence modifying the oxidation states of sulfur, and thus the electrochemical properties of the lithiated material thus obtained. The chemical composition, and particularly the stoichiometry, of the film obtained by the method of the invention depends on the target material used, but also on the presence of oxygen.

According to another specific embodiment implementing the cathode sputtering technique, the method may comprise an initial step of sputtering of a metal (for example, titanium) on a cache. This step enables to limit possible traces of oxygen and moisture. Only after this is the target material sputtered, possibly after a known quantity of oxygen has been introduced into the enclosure.

This step enables to better control the reproducibility of films.

The amorphous film, which advantageously has formula $Li_\alpha M(O_{1-\beta}S_\beta)_\gamma$ is obtained by deposition of the lithiated target material which may appear in the form of compacted or sintered crystallized powder.

The target material, particularly when it is made of a single compound, has the properties necessary to the electrodes of a lithium battery, that is, the ability to electrochemically extract lithium, while simultaneously oxidizing metal ions and/or sulfide ions (including polysulfides).

It may advantageously be synthesized, prior to its use, according to at least the two following embodiments:

by a liquid process, particularly by lithiation of a precursor material or formula $MS_y$ (y depends on the degree of oxidation of the metal). It may be the chemical lithiation of a powder of composition $MS_y$ (for example, $TiS_2$, $TiS_3$) by use of a lithium compound with reducing properties, such as n-butyl lithium. In this case, metal and/or sulfur are directly reduced on incorporation of lithium.

or by a solid process, particularly by reaction between a precursor material of formula $MS_w$ (or a mixture of precursors of this type) and or lithium sulfide and possibly the corresponding metal M (w depends on the degree of oxidation of the metal) and/or elemental sulfur. It may be the solid-state reaction of a mixture of powders made of: a $Li_2S+b\ MS_w+c\ M$ (for example, ½ $Li_2S+¾TiS_2+¼\ Ti \rightarrow LiTiS_2$). This mixture is submitted to a thermal treatment to ensure the forming of the target material (according to a specific embodiment, precursor material $MS_w$ may itself be prepared by reaction of metal M with elemental sulfur. This reaction may be performed in situ on manufacturing of the target).

The target material thus obtained in the form of a powder is then compacted and pressure-formed according to conventional techniques (single-axis pressing and isostatic pressing, for example).

Generally, metal M advantageously is titanium.

To improve the compactness and the mechanical behavior of the material, and this, whatever the way in which it is obtained, a thermal treatment is advantageously applied thereto:
  either in situ on shaping thereof, for example, by hot isostatic pressing or by SPS ("Spark Plasma Sintering");
  or ex situ in a furnace under an inert atmosphere.

It will always be attempted to obtain a dense target to guarantee its mechanical behavior, minimize its reactivity to atmosphere on handling thereof after manufacturing, and ensure a maximum deposition speed.

Figure 1A:
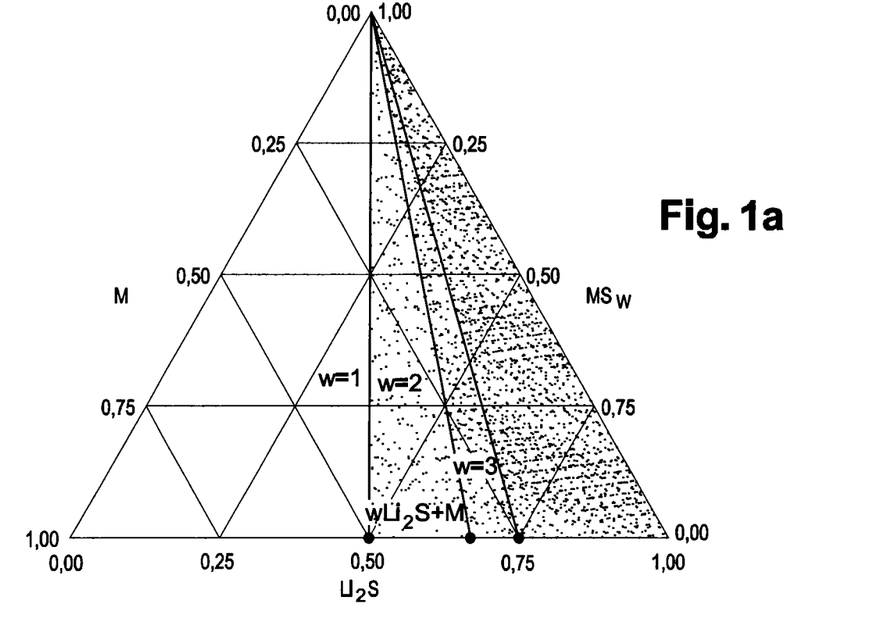
FIG. 1a shows the ternary diagram of the target material used in the method forming the object of the invention.

Considering the $Li_2S$-$MS_w$-M ternary diagram of FIG. 1a, the composition of the target material may advantageously correspond to the triangle defined by vertices $Li_2S$-$MS_w$-$(wLi_2S+M)$, straight line $MS_w$-$(wLi_2S+M)$ corresponding to the insertion of lithium into $MS_w$. The $MS_w$ compound corresponds to a metal sulfide, factor w depending on the degree of oxidation of the metal and on the type of sulfur anions $S_n^{2-}$ (n=1, 2, ...).

The precursor compound of formula $MS_w$ (or $MS_y$) may in particular be selected from the group comprising:
  titanium compounds $Ti_8S_9$, $Ti_8S_{10}$, $Ti_{16}S_{21}$, $TiS_2$, $TiS_3$;
  vanadium compounds $V_3S_4$, $V_5S_8$;
  chromium compounds $Cr_{1-\varepsilon}S$, $Cr_2S_3$;
  manganese compounds $Mn_{1-\varepsilon}S$;
  iron compounds $Fe_{1-\varepsilon}S$, $Fe_3S_4$, $FeS_2$;
  cobalt compounds $Co_9S_8$, $Co_{1-\varepsilon}S$, $Co_3S_4$, $CoS_2$;
  nickel compounds $Ni_3S_2$, $Ni_9S_9$, $Ni_{1-\varepsilon}S$, $Ni_3S_4$, $NiS_2$;
  copper compounds $Cu_{2-\varepsilon}S$, $CuS$;
  zinc compounds $ZnS$;
  aluminum compound $Al_2S_3$;
  germanium compounds $GeS$, $GeS_2$;
  zirconium compounds $ZrS_2$, $ZrS_3$;
  niobium compounds $Nb_{10}S_9$, $NbS$, $Nb_2S_3$, $NbS_2$;
  molybdenum compounds $Mo_6S_8$, $Mo_2S_3$, $MoS_2$, $MoS_3$;
  silver compound $Ag_2S$;
  cadmium compound $CdS$;
  indium compound $In_2S_3$;
  tin compounds $SnS$, $SnS_2$;
  antimony compounds $Sb_2S_3$, $Sb_2S_5$;
  tantalum compound $TaS_2$;
  tungsten compound $WS_2$;
  lead compound $PbS$;
  bismuth compound $Bi_2S_3$;
  and mixtures thereof.

Figure 1B:
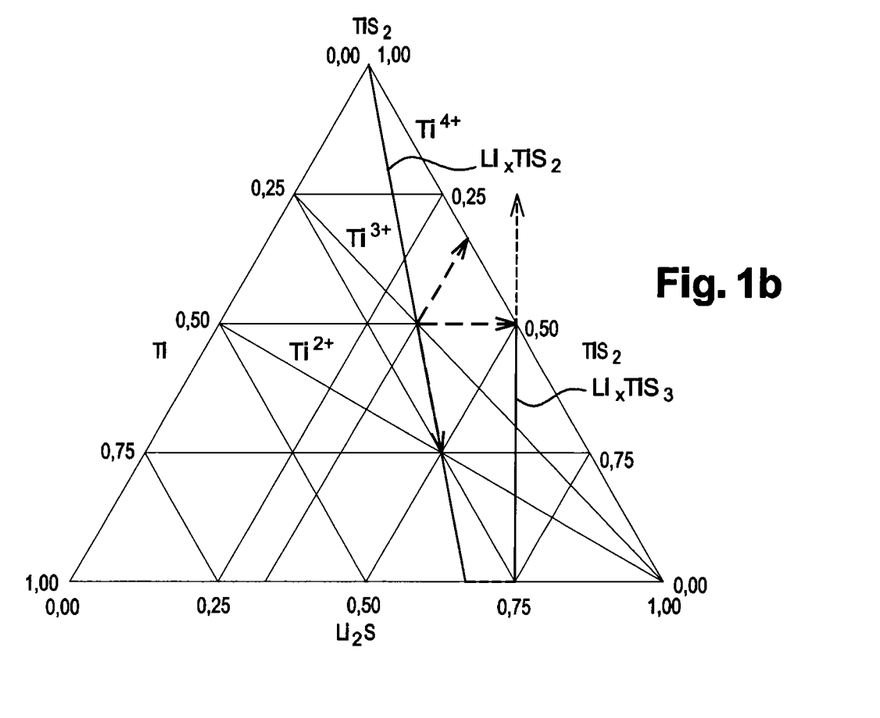
FIG. 1b shows the ternary diagram of the target material used in the method forming the object of the invention, when M is titanium and the precursor is $TiS_2$.

When the metal is titanium, the composition of the target metal is advantageously comprised in the triangle defined by tops $Li_2S$—$TiS_2$—$Li_4TiS_2$ of the ternary diagram of FIG. 1b for w=2 or $Li_2S$—$TiS_3$—$Li_6TiS_3$ for w=3.

The method forming the object of the invention enables to prepare thin films, having improved electrochemical properties with respect to prior art materials.

The obtained films may thus have a potential pseudo-stage 2.1 V (corresponding to oxidation-reduction processes on sulfur only), while post-lithiated films of prior art have a pseudo-stage between 1 and 3 V (S and Ti redox). However, in the context of the invention, it is also possible to have titanium work at a lower potential, which enables to increase the available capacity.

Further, the volume capacity of the film of the invention may advantageously be in the range from 40 to 200 microAh/(cm$^2$·µm) while it generally does not exceed 65 microAh/(cm$^2$·µm) in the case of prior art $LiCoO_2$ and $LiMn_2O_4$ films.

The S/O ratio influences the volume capacity of the material while it is used as an electrode material (particularly in a potential window centered around 2V/Li$^+$/Li). Further, the method forming the object of the invention enables to obtain a dense film thus having increased properties. Indeed, the volume capacity also depends on the film thickness, which acts on the (ionic or electronic) conduction kinetics, particularly when the applied currents are significant.

The method forming the object of the invention enables to modulate the film composition by adjusting the respective proportions of the target material precursor compounds (for example, $Li_2S/(M+MS_w)$). This method thus also enables to modulate the performance of the prepared film.

On this regard, an increase of $Li_2S$ causes an increase of the capacity due to the increased participation of sulfur to redox processes.

On the other hand, the increase of $(M+MS_w)$ causes an improvement of the cycling behavior at high current due to a better electronic conductivity.

The method forming the object of the invention thus enables to better control the stoichiometry of the deposited layers as compared with prior art methods implying a post-lithiation.

The present invention also relates to an electrode comprising a lithiated metal sulfide or oxysulfide film obtained according to the above-described method. It may be a positive or negative electrode. It is advantageously positive.

Further the battery, advantageously a Li-ion battery or microbattery, containing at least such an electrode, also belongs to the invention.

The method of preparing this Li-ion battery particularly comprises depositing an electrode, advantageously positive, from a lithiated target material, said electrode, advantageously positive, being formed of an amorphous film of lithiated metal sulfide or oxysulfide of formula $Li_\alpha M(O_{1-\beta}S_\beta)_\gamma$.

It will be within the abilities of those skilled in the art to select the appropriate materials, that is, the electrode materials, the electrolyte (liquid, solid, or gel), the current collectors, to prepare the lithium (micro)battery.

The electrode formed of the amorphous film of the invention enables to form an interface of good quality with the electrolyte due to its increased density and to the low roughness of its surface state.

The invention and the resulting advantages will better appear from the following non-limiting drawings and examples, provided as an illustration of the invention.

EMBODIMENTS OF THE INVENTION

The following examples show the implementation of the method forming the object of the invention to prepare thin $Li_\alpha M(O_{1-\beta}S_\beta)_\gamma$ films and their use in a lithium battery. Three target materials have also been prepared, either by a liquid process (example 1), or by a solid process (examples 1 and 2).

Figure 2A:
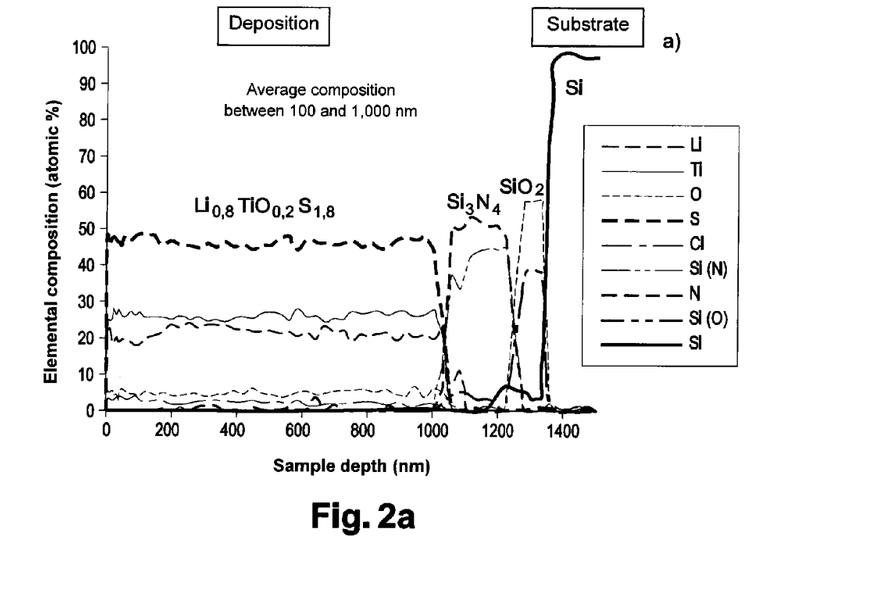
FIG. 2a shows the graph corresponding to the elementary composition determined by Auger spectroscopy of a $Li_{0.8}TiO_{0.2}S_{1.8}$ film according to the invention, according to depth.
Figure 2B:
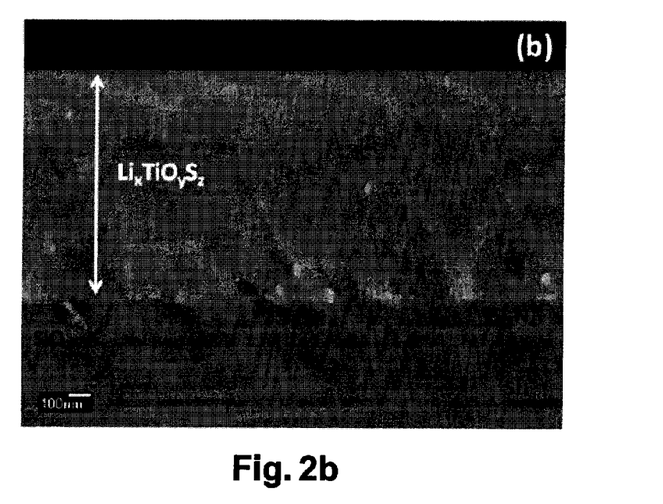
FIG. 2b shows the SEM (scanning electron microscopy) photography of the cross-section of a $Li_{0.8}TiO_{0.2}S_{1.8}$ film according to the invention.
Figure 5A:
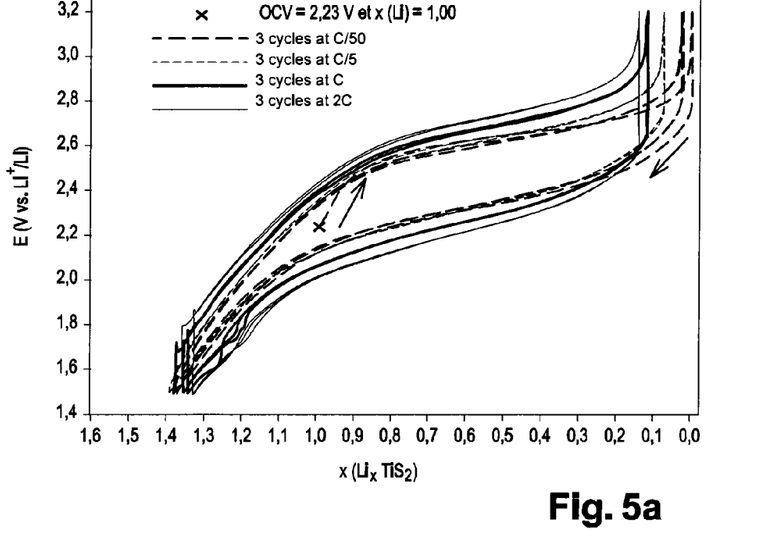
FIG. 5a shows the graph corresponding to the galvanostatic cycling at different current rates of a $Li_{0.8}TiO_{0.2}S_{1.8}$ film according to the invention.
Figure 5B:
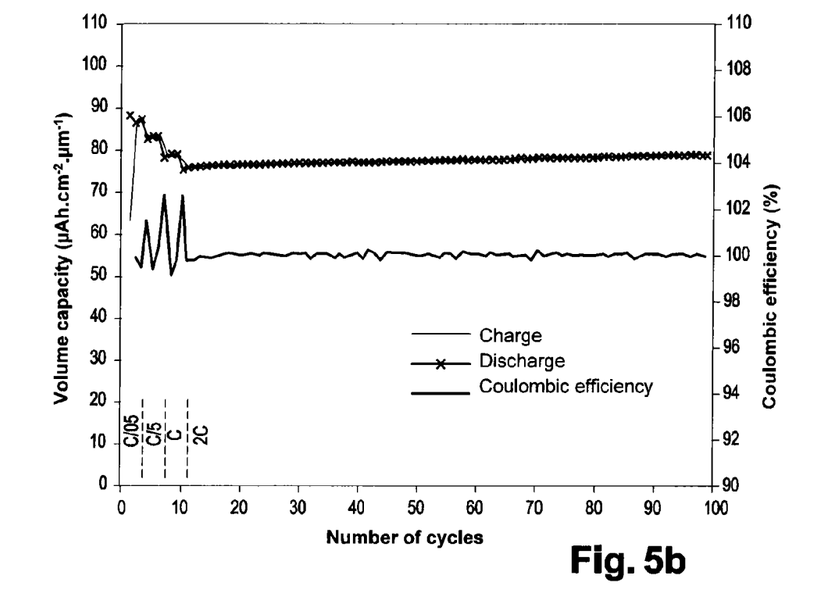
FIG. 5b shows the variation of the volume capacity (left-hand scale) according to the number of cycles of a $Li_{0.8}TiO_{0.2}S_{1.8}$ according to the invention. It also shows the coulombic efficiency (right-hand scale) according to the number of cycles of a $Li_{0.8}TiO_{0.2}S_{1.8}$ film according to the invention.

Example 1: Thin $Li_{0.8}TiO_{0.2}S_{1.8}$ Film (FIGS. 2 and 5)

The $LiTiS_2$ target material is prepared by a liquid process, under an inert atmosphere (Ar) in a glove box, by reaction between titanium sulfide $TiS_2$ (Aldrich, 99.9%) dissolved in anhydrous hexane with n-butyl lithium (Aldrich, at 1.6 M in hexane). The mixture is stirred at the ambient temperature for one week.

The obtained powder is then filtered, and washed in hexane, and dried at ambient temperature under argon.

Approximately 15 g of the $LiTiS_2$ material thus obtained are pressed in a mold under a pressure of approximately $6 \cdot 10^7$ $N \cdot m^{-2}$ to obtain a $LiTiS_2$ target having a 5-centimeter diameter and an approximate 5-millimeter thickness.

The target material is then placed in a magnetron cathode radiofrequency cathode sputtering enclosure to deposit a thin $Li_\alpha M(O_{1-\beta}S_\beta)_\gamma$ film according to the following conditions:

The PLASSYS-type sputtering enclosure is connected to a glove box. It is fitted with two cathodes. The $LiTiS_2$ target is positioned on one of these cathodes while a commercial Ti target (Lesker 99.7%) is positioned on the other cathode.

The enclosure is then placed under vacuum (limiting vacuum lower than $5 \cdot 10^{-7}$ mbar).

An initial titanium deposition is performed on a cache for 20 minutes to at least partly trap the oxygen and the water that may be present in the enclosure.

In this example, additional oxygen is not intentionally introduced into the sputtering enclosure.

The thin $Li_{0.8}TiO_{0.2}S_{1.8}$ film is then formed by sputtering of the $LiTiS_2$ target on a silicon-based substrate. The deposition is performed for 45 minutes, at a total pressure of 0.5 Pa, under an argon flow of 20 $mL \cdot min^{-1}$, and with a 25-W power applied to the $LiTiS_2$ target.

The deposition speed is approximately 5 $nm \cdot min^{-1}$ in these conditions.

The amorphous and dense thin $Li_{0.8}TiO_{0.2}S_{1.8}$ film thus obtained (FIG. 2) has a thickness of approximately 600 nanometers. Its electrochemical performance has been tested in a liquid electrolyte and in Li-metal configuration.

Auger spectroscopy provides a depth composition profile in order to study the homogeneity of the layer. The compositions have also been determined by ICP, RBS, and Castaing microprobe.

Figure 3A:
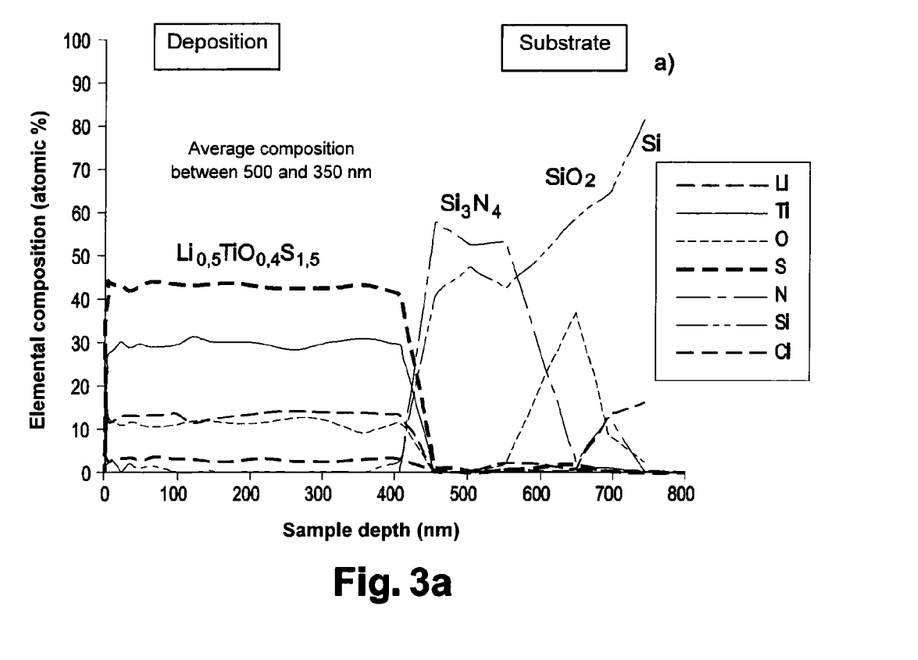
FIG. 3a shows the elementary composition determined by Auger spectroscopy of a $Li_{0.5}TiO_{0.4}Si_{1.5}$ film according to the invention, according to depth.
Figure 3B:
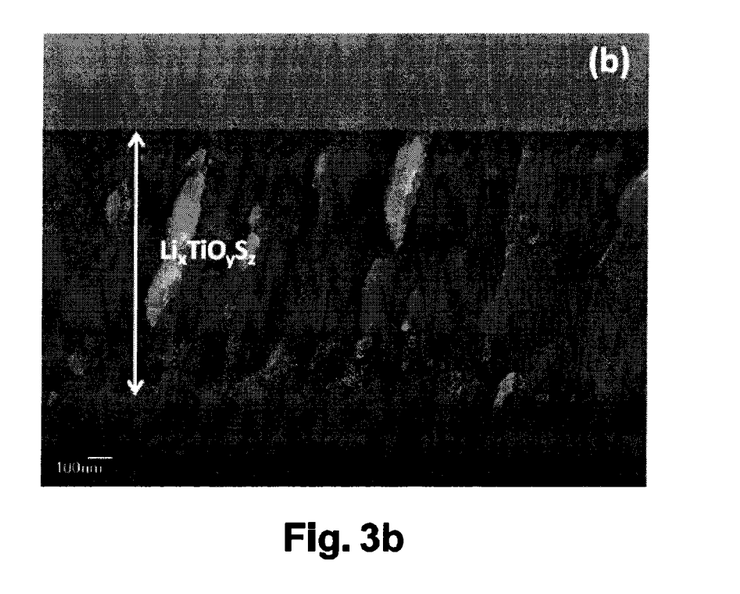
FIG. 3b shows the SEM photography of the cross-section of a $Li_{0.5}TiO_{0.4}S_{1.5}$ film according to the invention.
Figure 6A:
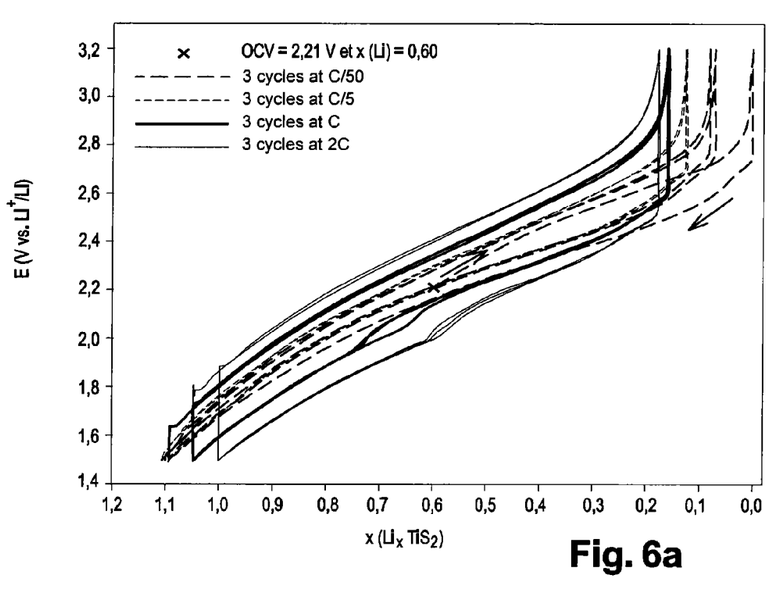
FIG. 6a shows the graph corresponding to the galvanostatic cycling at different current rates of a $Li_{0.5}TiO_{0.4}S_{1.5}$ film according to the invention.
Figure 6B:
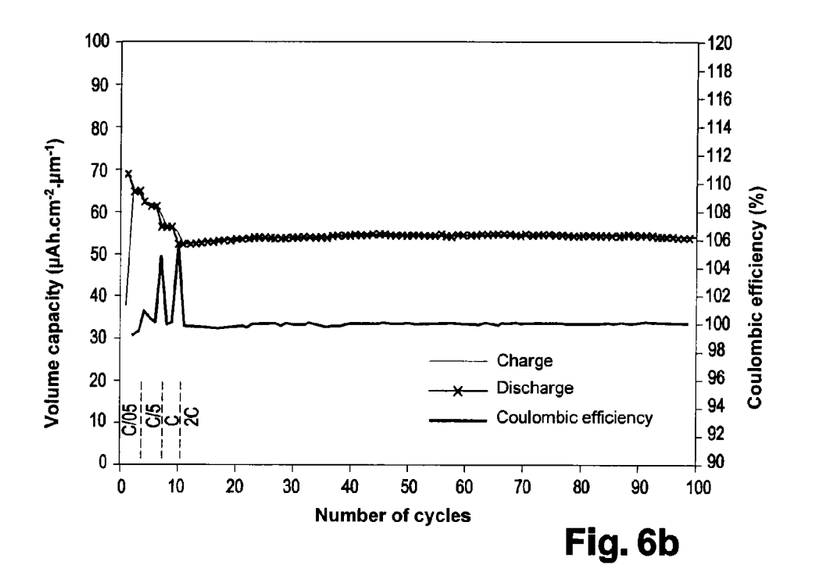
FIG. 6b shows the variation of the volume capacity (left-hand scale) according to the number of cycles of a $Li_{0.5}TiO_{0.4}S_{1.5}$ according to the invention. It also shows the coulombic efficiency (right-hand scale) according to the number of cycles of a $Li_{0.5}TiO_{0.4}S_{1.5}$ film according to the invention.

Example 2: Thin $Li_{0.5}TiO_{0.4}S_{1.5}$ Film (FIGS. 3 and 6)

The $LiTiS_2$ target material is prepared by a solid process, from a mixture of $TiS_2$ (Aldrich 99.9%), $Li_2S$ (Alfa Aesar 99.9%), and Ti (Alfa Aesar 99.99%) in molar proportions (¾: ½: ¼) enabling to obtain the desired $LiTiS_2$ stoichiometry.

Approximately 15 g of the mixture thus obtained are mixed under argon by means of a planetary mill before being shaped in a mold and pressed under approximately $6 \cdot 10^7$ $N \cdot m^{-2}$ to obtain a target of precursor material having a 5-centimeter diameter and a thickness of approximately 5 millimeters.

This pellet is then submitted to a thermal treatment under argon, at 425° C. for 40 hours to obtain the $LiTiS_2$ target.

The thin $Li_{0.5}TiO_{0.4}S_{1.5}$ film is then formed by sputtering of the $LiTiS_2$ target in the same conditions as those of example 1. It has a thickness of approximately 700 nanometers.

Amorphous and dense depositions having a slightly different composition, comprising less lithium and sulfur, than depositions resulting from the liquid process of example 1 are obtained (FIG. 3).

Their electrochemical performance tested in liquid electrolyte and in Li-metal configuration are advantageous but remain lower than those of the likes of the liquid process of example 1.

Figure 7A:
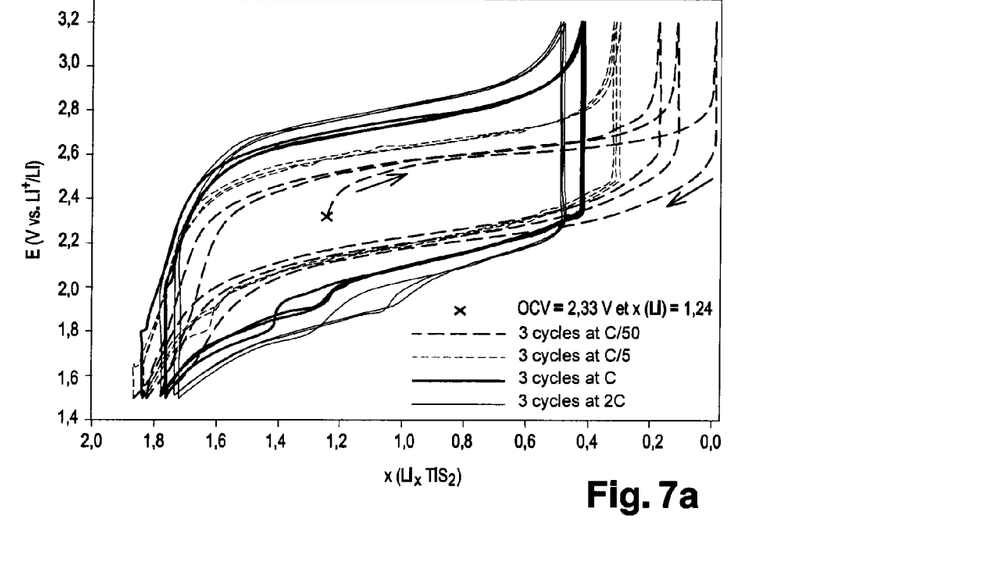
FIG. 7a shows the graph corresponding to the cycling at different current rates of a $Li_{1.8}TiO_{0.4}S_{2.5}$ film according to the invention.
Figure 7B:
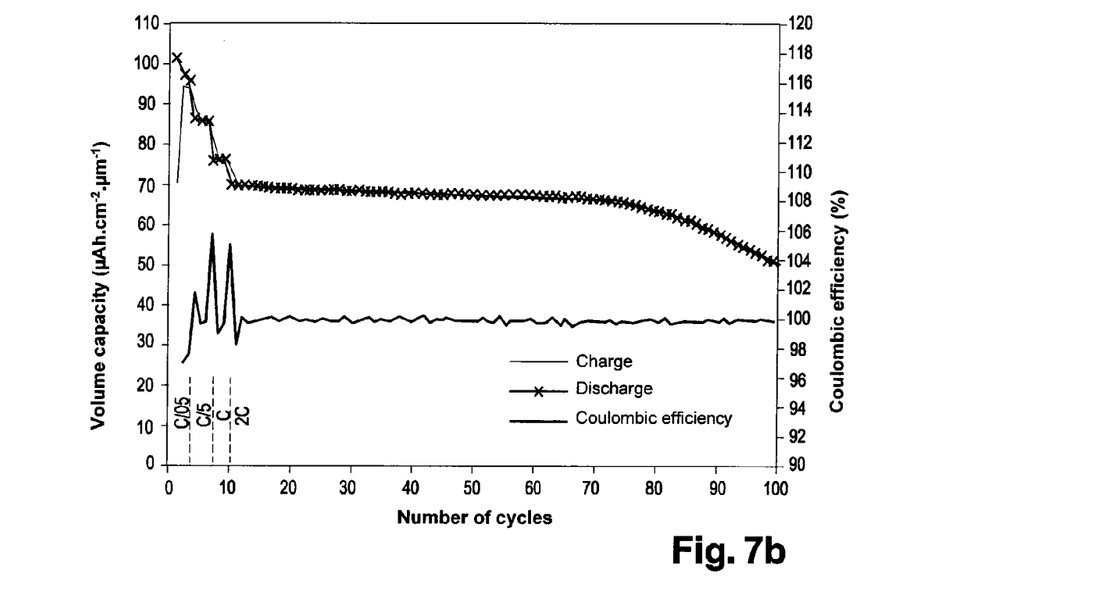
FIG. 7b shows the variation of the volume capacity (left-hand scale) according to the number of cycles of a $Li_{1.8}TiO_{0.4}S_{2.5}$ film according to the invention. It also shows the coulombic efficiency (right-hand scale) according to the number of cycles of a $Li_{1.8}TiO_{0.4}S_{2.5}$ film according to the invention.

Example 3: Thin $Li_{1.8}TiO_{0.4}S_{2.5}$ Film (FIGS. 4 and 7)

A thin $Li_\alpha M(O_{1-\beta}S_\beta)_\gamma$ film, comprising more lithium and sulfur, is prepared by following the experimental protocol of example 2. Only the composition of the target and its synthesis temperature have been modified.

A $Li_2TiS_3$ stoichiometry target is formed by a solid process from a mixture containing an equimolar quantity of $TiS_2$ (Aldrich 99.9%) and $Li_2S$ (Alfa Aesar 99.9%). The thermal treatment temperature of this precursor mixture shaped as a target is 450° C.

Figure 4A:
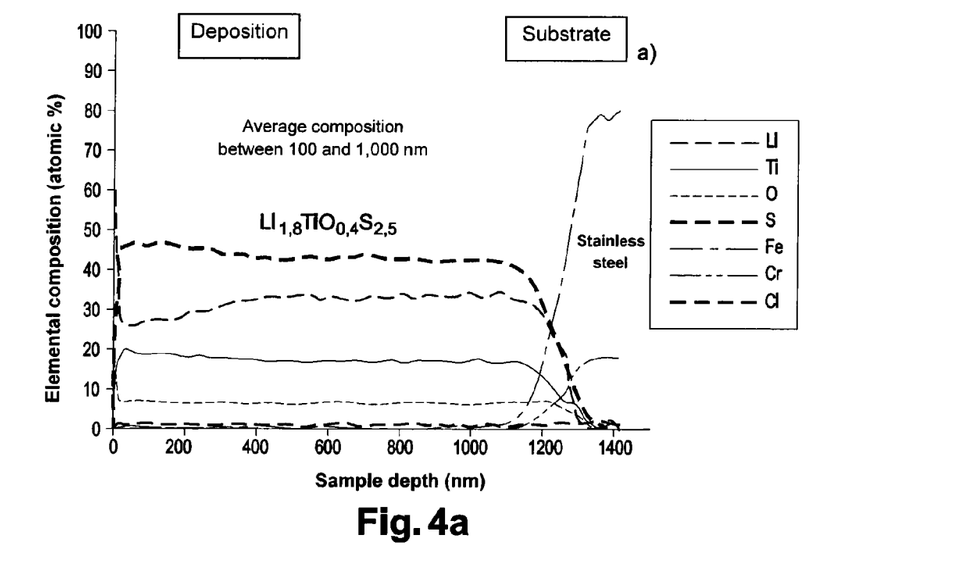
FIG. 4a shows the elementary composition determined by Auger spectroscopy of a $Li_{1.8}TiO_{0.4}S_{2.5}$ film according to the invention, according to depth.
Figure 4B:
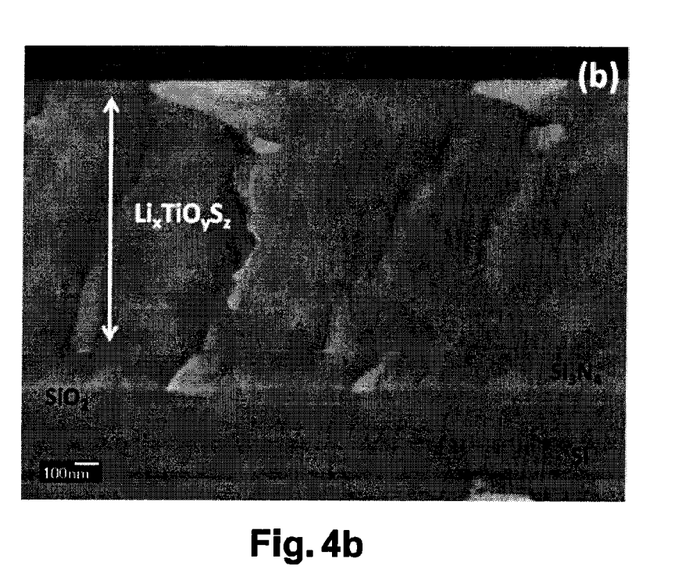
FIG. 4b shows the SEM photography of the cross-section of a $Li_{1.8}TiO_{0.4}S_{2.5}$ film according to the invention.

After deposition by cathode sputtering in the same experimental conditions as for examples 1 and 2, a film having a thickness of approximately 600 nanometers, of amorphous and dense $Li_{1.8}TiO_{0.4}S_{2.5}$ composition, and having a composition different from the films of examples 1 and 2, is obtained (FIG. 4).

The electrochemical performance in liquid electrolyte and in Li-metal configuration of this film is higher in terms of capacity even if the cyclability in liquid electrolyte remains limited given the dissolution of sulfur therein.

GENERAL COMMENT

FIGS. 5a, 6a, 7a show the cycling curves of the different obtain thin $Li_\alpha Ti(O_{1-\beta}S_\beta)_\gamma$ films. They confirm the possibility of electrochemically extracting lithium at the first charge (quantity comprised in these examples, between 0.6 and 1.3 Li/Ti according to the film composition) and thus of using them as positive electrodes in electrochemical lithium-ion systems.

Differences in the shape of the curves between these compositions result from the contributions, specific to each of the compositions, of electrochemical processes implying sulfur or titanium. Indeed, redox processes implying sulfur occur at higher potential, and generate a higher potential hysteresis, while those implying titanium occur with a lower potential and generate no significant hysteresis.

FIGS. 5b, 6b, 7b show the cyclability of these films and the coulombic efficiency of the electrochemical reaction are very good, even at high current rates.

It should also be noted that since the cycling of these films has been performed in a liquid electrolyte, degradation processes linked to the progressive solubilizing of sulfur species occur. These in particular explain the faster loss of capacity observed after 70 cycles in FIG. 7b, and the presence of a "step" at the end of certain discharges on the curves of FIGS. 5a, 6a, 7a. Such phenomena do not occur in a microbattery comprising a solid electrolyte.

The invention claimed is:

1. A method of preparing an amorphous film, the method comprising using a lithiated target material to prepare an amorphous film of lithiated metal sulfide or oxysulfide of formula $Li_\alpha M(O_{1-\beta}S_\beta)_\gamma$, wherein:
M is a metal;
$\alpha \geq 0.5$;
$1 \geq \beta \geq 2/3$; and
$2 \geq \alpha/\gamma \geq 1/3$,
wherein M is selected from the group consisting of Ti, V, Cr, Mn, Fe, Co, Ni, Cu, Zn, Ge, Zr, Nb, Mo, Ag, Cd, In, Sn, Sb, Ta, W, Pb, and Bi, and mixtures thereof,
and wherein a ratio S/O is at least greater than 2 and a ratio Li/(S+O) is greater than 1/3.

2. The method of claim 1, wherein the lithiated target material has formula $Li_\lambda M(O_{1-\delta}S_\delta)_\nu$, wherein:

$\lambda \geq 0.5$;
$1 \geq \delta \geq 2/3$; and
$2 \geq \lambda/\nu \geq 1/3$.

3. The method of claim 1, wherein the amorphous film is prepared by implementing a technique selected from the group consisting of cathode sputtering of the lithiated target material, evaporation of the lithiated target material, and laser ablation of the lithiated target material.

4. The method of claim 1, wherein the lithiated target material is prepared, prior to its use, by a liquid process, by lithiation of a precursor material of formula $MS_y$, wherein M is a metal and y depends on the degree of oxidation of the metal.

5. The method of claim 1, wherein the lithiated target material is prepared, prior to its use, by a solid process, by reaction between a precursor material of formula $MS_y$, and lithium sulfide $Li_2S$, and possibly the corresponding metal M and/or elemental sulfur.

6. The method of claim 1, wherein the metal M is titanium.

7. The method of claim 4, wherein the precursor of formula $MS_y$ is selected from the group consisting of titanium compounds $Ti_8S_9$, $Ti_8S_{10}$, $Ti_{16}S_{21}$, $TiS_2$, or $TiS_3$; vanadium compounds $V_3S_4$, or $V_5S_8$; chromium compounds $Cr_{1-\varepsilon}S$, or $Cr_2S_3$; manganese compounds $Mn_{1-\varepsilon}S$; iron compounds $Fe_{1-\varepsilon}S$, $Fe_3S_4$, or $FeS_2$; cobalt compounds $Co_9S_8$, $Co_{1-\varepsilon}S$, $Co_3S_4$, or $CoS_2$; nickel compounds $Ni_3S_2$, $Ni_9S_8$, $Ni_{1-\varepsilon}S$, $Ni_3S_4$, or $NiS_2$; copper compounds $Cu_{2-\varepsilon}S$, or $CuS$; zinc compound $ZnS$; germanium compounds $GeS$, or $GeS_2$; zirconium compounds $ZrS_2$, or $ZrS_3$; niobium compounds $Nb_{10}S_9$, $NbS$, $Nb_2S_3$, or $NbS_2$; molybdenum compounds $Mo_6S_8$, $Mo_2S_3$, $MoS_2$, or $MoS_3$; silver compound $Ag_2S$; cadmium compound $CdS$; indium compound $In_2S_3$; tin compounds $SnS$, or $SnS_2$; antimony compounds $Sb_2S_3$, or $Sb_2S_5$; tantalum compound $TaS_2$; tungsten compound $WS_2$; lead compound $PbS$; bismuth compound $Bi_2S_3$; and mixtures thereof.

8. The method of claim 3, wherein the method is carried out in a deposition enclosure in the presence of oxygen in the form of molecular or atomic oxygen, of metal oxide, or of metal oxysulfide present in the target material.

9. A method of preparing a Li-ion battery comprising an electrode, wherein said electrode comprises as film of lithiated metal sulfide or oxysulfide obtained according to the method of claim 1, the method of preparing said Li-ion battery comprising depositing said electrode from said lithiated target material, said electrode being formed of an amorphous film of lithiated metal sulfide or oxysulfide of formula $Li_\alpha M(O_{1-\beta}S_\beta)_\gamma$.

10. The method of claim 2, wherein the amorphous film is prepared by implementing a technique selected from the group consisting of cathode sputtering of the lithiated target material, evaporation of the lithiated target material, and laser ablation of the lithiated target material.

11. The method of claim 2, wherein the metal M is titanium.

12. The method of claim 2, wherein the lithiated target material is prepared, prior to its use, by a liquid process, by lithiation of a precursor material of formula $MS_y$, wherein M is a metal and y depends on the degree of oxidation of the metal.

13. The method of claim 12, wherein the metal M is titanium.

14. The method of claim 2, wherein the lithiated target material is prepared, prior to its use, by a solid process, by reaction between a precursor material of formula $MS_w$ and lithium sulfide $Li_2S$, and possibly the corresponding metal M and/or elemental sulfur.

15. The method of claim 14, wherein the metal M is titanium.

16. The method of claim 5, wherein the precursor of formula $MS_y$ or $MS_w$ is selected from the group consisting of titanium compounds $Ti_8S_9$, $Ti_8S_{10}$, $Ti_{16}S_{21}$, $TiS_2$, or $TiS_3$; vanadium compounds $V_3S_4$, or $V_5S_8$; chromium compounds $Cr_{1-\varepsilon}S$, or $Cr_2S_3$; manganese compounds $Mn_{1-\varepsilon}S$; iron compounds $Fe_{1-\varepsilon}S$, $Fe_3S_4$, or $FeS_2$; cobalt compounds $Co_9S_8$, $Co_3S_4$, or $CoS_2$; nickel compounds $Ni_3S_2$, $Ni_9S_8$, $Ni_{1-\varepsilon}S$, $Ni_3S_4$, or $NiS_2$; copper compounds $Cu_{2-\varepsilon}S$, or $CuS$; zinc compound $ZnS$; germanium compounds $GeS$, or $GeS_2$; zirconium compounds $ZrS_2$, or $ZrS_3$; niobium compounds $Nb_{10}S_9$, $NbS$, $Nb_2S_3$, or $NbS_2$; molybdenum compounds $Mo_6S_8$, $Mo_2S_3$, $MoS_2$, or $MoS_3$; silver compound $Ag_2S$; cadmium compound $CdS$; indium compound $In_2S_3$; tin compounds $SnS$, or $SnS_2$; antimony compounds $Sb_2S_3$, or $Sb_2S_5$; tantalum compound $TaS_2$; tungsten compound $WS_2$; lead compound $PbS$; bismuth compound $Bi_2S_3$; and mixtures thereof.

\* \* \* \* \*

UNITED STATES PATENT AND TRADEMARK OFFICE
CERTIFICATE OF CORRECTION

PATENT NO. : 10,199,634 B2
APPLICATION NO. : 14/893831
DATED : February 5, 2019
INVENTOR(S) : Le Cras et al.

It is certified that error appears in the above-identified patent and that said Letters Patent is hereby corrected as shown below:

In the Claims

Column 11, Line 12: Claim 16 Delete "$Co_3S_4$," and insert -- $Co_{1-\varepsilon}S$, $Co_3S_4$, --

Signed and Sealed this
Second Day of April, 2019

Andrei Iancu
*Director of the United States Patent and Trademark Office*